United States Patent [19]
Koslov

[11] Patent Number: 5,867,539
[45] Date of Patent: Feb. 2, 1999

[54] METHODS AND APPARATUS FOR REDUCING THE EFFECT OF IMPULSE NOISE ON RECEIVERS

[75] Inventor: Joshua L. Koslov, Hopewell, N.J.

[73] Assignee: Hitachi America, Ltd., Tarrytown, N.Y.

[21] Appl. No.: 505,056

[22] Filed: Jul. 21, 1995

[51] Int. Cl.$^6$ .............................. H03D 1/06; H04B 1/10; H04L 1/00; H04L 27/22
[52] U.S. Cl. .......................... 375/346; 375/285; 375/227; 375/326; 455/222
[58] Field of Search ..................................... 375/346, 324, 375/351, 326, 340, 317, 261, 285, 344, 345, 284, 348, 320, 321, 227, 228; 329/304; 455/214, 296, 222, 223, 218, 219, 220, 221, 224

[56] References Cited

U.S. PATENT DOCUMENTS

| | | | |
|---|---|---|---|
| 4,353,093 | 10/1982 | Durbin, Jr. et al. | 348/616 |
| 4,458,355 | 7/1984 | Motley et al. | 375/346 |
| 4,783,658 | 11/1988 | Nakano et al. | 375/317 |
| 5,214,675 | 5/1993 | Mueller et al. | 375/347 |
| 5,440,582 | 8/1995 | Birchler et al. | 375/227 |
| 5,507,037 | 4/1996 | Bartkowiak et al. | 375/346 |
| 5,649,321 | 7/1997 | Kellenberger | 455/221 |
| 5,659,583 | 8/1997 | Lane | 375/346 |

OTHER PUBLICATIONS

Donald G. Fink, Donald Christiansen, editors, *Electronic Engineers'Handbook*, third edition, McGraw–Hill (1989), pp. 4–48, 4–49; 20–84 and 20–85.
N.K. Jablon, "Joint Blind Equalization, Carrier Recovery, and Timing Recovery for High–Order QAM Signal Constellations", *IEEE Transactions on Signal Processing*, vol. 40, No. 6, Jun. 1992, pp. 1383–1398.
N.K. Jablon, Joint Blind Equalization, Carrier Recovery, and Timing Recovery for 64–QAM and 128–QAM Signal Constellations, *Record of IEEE International Conference on Communications (Boston, Massachusetts)*, Jun. 11–14, 1989, pp. 1043–1049.
A. Benveniste et al., "Blind Equalizers", *IEEE Transactions on Communications*, vol. COM–32, No. 8, Aug. 1984, pp. 871–883.
Donald G. Fink, Donald Christiansen (Editors), Electronics Engineers'Handbook, Third Ed. (1989), pp. 4–48, 4–49, 20–84, 20–85.

*Primary Examiner*—Stephen Chin
*Assistant Examiner*—Betsy L. Deppe
*Attorney, Agent, or Firm*—Michaelson & Wallace; Peter L. Michaelson; Michael P. Straub

[57] ABSTRACT

Methods and apparatus for detecting the presence of impulse noise in a signal representing digital data and for performing a limiting or blanking operation in a receiver in response thereto are disclosed. In accordance with the present invention, to detect the presence of impulse noise, in one embodiment, the instantaneous sliced error energy for each received symbol is estimated and compared to either a predetermined threshold level indicative of impulse noise or to an adaptive impulse noise threshold level. In an adaptive impulse noise threshold embodiment, an adaptive impulse noise threshold value is generated by averaging the instantaneous sliced error energy values over a period of many symbols and by then applying a preselected gain to the averaged sliced error energy value to obtain an impulse noise threshold value. When impulse noise is detected a signal is asserted to indicate the detection and presence of the impulse noise and carrier recovery phase error correction operations and other decision dependent operations blanked or left unchanged until the impulse noise is no longer detected or for a preselected period of time after impulse noise has been detected.

25 Claims, 4 Drawing Sheets

METHODS AND APPARATUS FOR REDUCING THE EFFECT OF IMPULSE NOISE ON RECEIVERS

FIELD OF THE INVENTION

The present invention is directed to methods and apparatus for detecting impulse noise in digital systems and for limiting the effect impulse noise has on a receiver circuit.

BACKGROUND OF THE INVENTION

The transmission of data in digital form is becoming common place. Present day transmission channels over which digital data is sent suffer from various impairments including additive impulse noise.

Additive impulse noise can disturb the operation of various systems within a receiver such as the demodulator portion of the receiver. The demodulator portion of a receiver can include, e.g., a carrier recovery system and an equalization update system. Such systems can have difficulty in performing their functions properly when highly erroneous impulse noise signals are present.

The *Electronic Engineers' Handbook,* third edition, McGraw-Hill 1989 states as a general proposition for receiver circuits that "if the noise consists of large impulses of relatively low density, the best system performance is obtained if the system is limited or blanked during the noisy periods and behaves normally when the (impulse) noise is not present."

While this statement suggests the desirability of limiting or blanking a receiver during the receipt of impulse noise, it fails to describe how to detect the presence of impulse noise in a signal representing digital data and how to implement the limiting or blanking operation suggested.

In the case of a signal representing digital data, the signal may be demodulated to correspond to one of a plurality of different discrete energy levels, impulse noise affecting the decision processes may fall within the overall permitted amplitude range for the signal being transmitted but still result in improper decisions being made since the impulse noise can cause a signal to take on an erroneous or indeterminate value. This may affect a circuit's ability to accurately demodulate received symbols over a period extending beyond the duration of the impulse noise.

Because of carrier recovery implications, improper decisions resulting from impulse noise can present particularly serious problems in systems which use Quadrature Amplitude Modulation ("QAM"). In many QAM demodulator circuits carrier recovery is performed by calculating a phase error on each received symbol based upon the angular difference between an incoming symbol and its target, e.g., desired, value. This phase error is then used to drive a phase-locked loop (PLL), e.g., a digital PLL (DPLL), to lock a derotating sine wave to the signal. When noise impulses arrive, the phase error determination can be totally wrong if the incoming symbol is driven into an incorrect decision box. In such a case, an incorrect target symbol may be used in the phase error calculation resulting in a possible loss of signal lock which can affect the decoding of several symbols thereafter.

Accordingly, there is a need for providing a method and apparatus for accurately determining the presence of impulse noise in a digital receiver circuit, such as a QAM or PAM-VSB demodulator circuit. Furthermore, it is desirable that such methods and apparatus be able to determine the presence of impulse noise even when other noise is relatively small thereby permitting proper limiting or disablement of various portions of the receiver system during the presence of impulse noise to prevent, e.g., loss of signal lock.

Furthermore, it is highly desirable for economic reasons that such impulse noise detection methods and apparatus be relatively simple, easy to implement, and compatible with a plurality of demodulator designs.

SUMMARY OF THE INVENTION

The present invention provides methods and apparatus for detecting the presence of impulse noise in a receiver and for performing a limiting or blanking operation in response thereto.

The impulse noise detection methods and apparatus of the present invention are based on the principle that impulse noise, when present in a system, is normally higher in amplitude than average noise in the system caused by, e.g., gaussian noise, quantization noise, etc.

In accordance with the present invention, to detect the presence of impulse noise, in one embodiment the instantaneous sliced error energy for each received symbol is estimated and compared to either a predetermined threshold level indicative of impulse noise or to an adaptive impulse noise threshold level. In one embodiment, an adaptive impulse noise threshold value is generated by averaging the instantaneous sliced error energy values over a period of many symbols and by then applying a preselected gain to the averaged sliced error energy value to obtain an impulse noise threshold value.

When impulse noise is detected a signal is asserted to indicate the detection and presence of the impulse noise.

In various embodiments, carrier recovery phase error correction operations and other decision dependent operations are modified appropriately until the impulse noise is no longer detected or for a preselected period of time after impulse noise has been detected.

Numerous other features and embodiments of the methods and apparatus of the present invention are described in the detailed description which follows.

DETAILED DESCRIPTION

Figure 1:
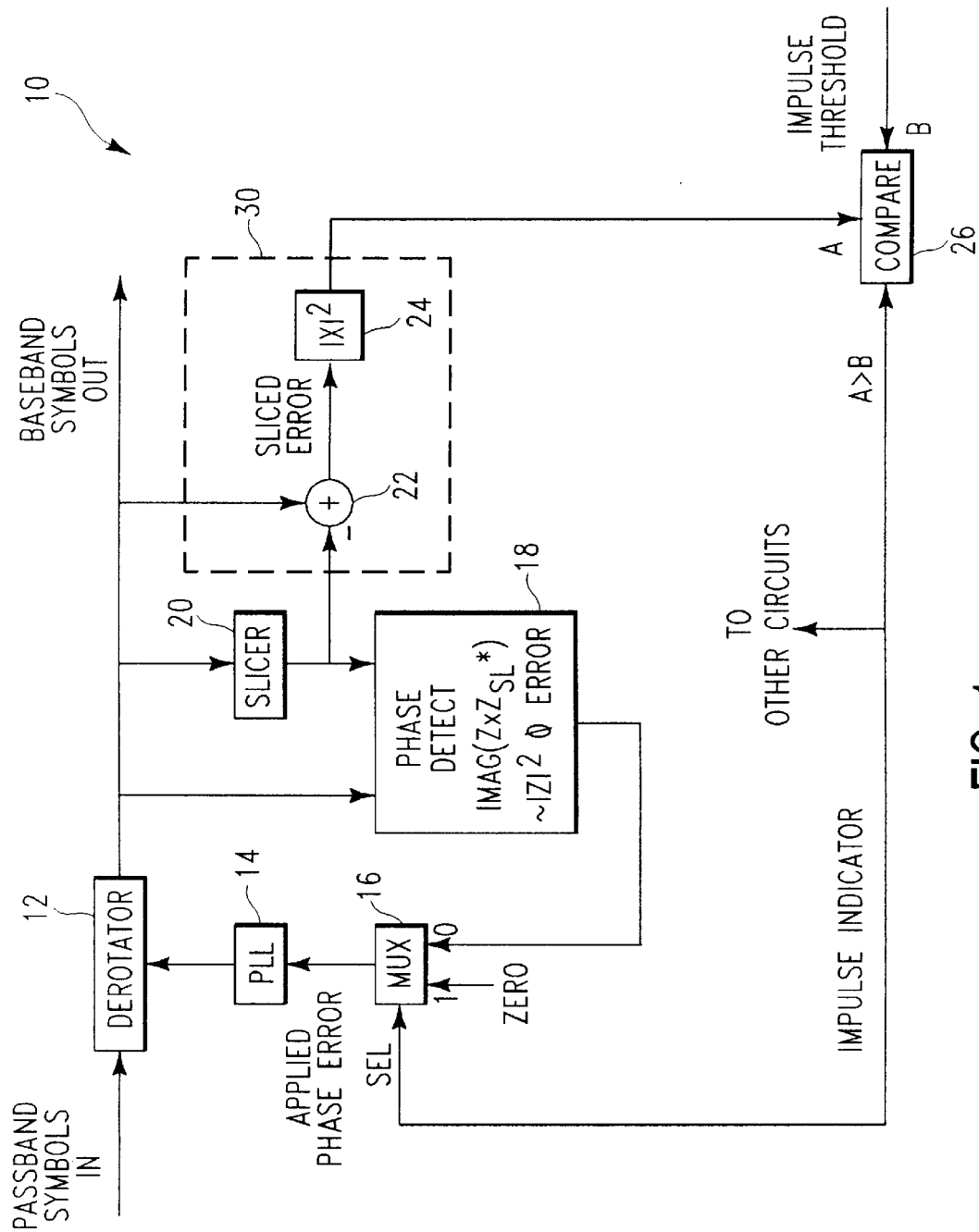
FIG. 1 is a schematic block diagram of an impulse noise detection circuit implemented in accordance with a first embodiment of the present invention.

Referring now to the drawings, and initially to FIG. 1, there is illustrated a QAM demodulator circuit generally represented by the reference numeral 10 which is implemented in accordance with a first embodiment of the present invention.

The demodulator circuit 10 comprises a derotator 12, a slicer 20, a phase error correction ("PEC") circuit 14 and a phase error detection circuit 18. In addition, the demodulator circuit 10 comprises a sliced error energy estimation circuit 30, a comparator circuit 26, and a multiplexer (MUX) 16.

The PEC circuit 14 may comprise a loop filter plus a voltage or numerically controlled oscillator.

The derotator 12 receives QAM symbols, e.g., at passband, and brings the received symbols to baseband as a function of a phase error correction signal output by the PEC circuit 14. The output of the derotator 12, which is the QAM baseband symbol stream, is sliced into target symbols by the slicer 20.

The baseband symbols output by the derotator 12 are supplied to the input of the phase error detection circuit 18 and the sliced error energy estimation circuit 30, as are the target symbols generated by the slicer 20. The phase error detection circuit 18 uses the baseband symbols and the corresponding target symbols, i.e., sliced values corresponding to the baseband symbols, as is known in the art, to calculate phase error values. The calculated phase error values are used, e.g., for carrier recovery purposes.

The sliced error energy estimation circuit 30 comprises a summer 22 and a squarer 24. While it is possible to estimate the sliced error energy in a number of different ways, in the embodiment of FIG. 1, the target symbol values are subtracted from the baseband symbol values by the subtractor 22 and then the result of the subtraction operation is squared by the squarer 24. The output of the squarer 24 represents an estimate of the instantaneous sliced error energy corresponding to the symbol being processed. It is to be understood that in the case of a QAM signal, the sliced error energy estimation circuit 30 operates on complex values. Accordingly, the summer 22 will produce a complex output representing the in-phase (I-) and quadrature phase (Q-) errors between the baseband and target symbols. The squarer 24 will operate to sum the squares of the in-phase and quadrature phase errors produced by the summer 22.

Thus, in the embodiment of FIG. 1, the instantaneous noise or error energy is calculated by observing the error between the incoming symbols and the target points and by squaring the observed value. That is:

$$\text{instantaneous sliced error energy} = (Z_{IN} - Z_{SLICED})^2,$$

where $Z_{IN}$ is the incoming symbol value and $Z_{SLICED}$ is the target symbol value for the decision region within which $Z_{IN}$ falls.

As an alternative to using a squarer 24 to estimate the size of the sliced error, absolute error energy might be used to provide an indication of the size of the sliced error. That is, sliced error energy could be calculated as $|Z_{IN} - Z_{SLICED}|$.

In accordance with the present invention, an indicator of the size of the sliced error, for example squared error energy as used in FIG. 1, or the absolute value of the sliced error energy, is compared to either a fixed or adaptive threshold. If the threshold is exceeded, as indicated by the result of the comparison operation than the presence of impulse noise is declared.

If the noise in a system is gaussian in distribution, the probability that the sliced error energy will exceed a given threshold depends on the size of the threshold relative to sigma—the root-mean-squared (RMS) value of error. For example, the gaussian noise will exceed 3*sigma in amplitude (or 9*sigma$^2$ in energy) only 0.03 (3 percent) of the time. On the other hand, an impulse value can be expected to exceed 5 or 10 times sigma. Such a value will occur exceedingly rarely if the noise is strictly gaussian in its distribution.

Referring once again to the embodiment of FIG. 1, the output of the squarer 24 which represents squared sliced error energy, represented by the letter A in FIG. 1, is supplied to a first input of the comparator 26. The comparator 26 serves to compare the sliced error energy A to a fixed impulse noise threshold represented by the letter B. Thus, in the FIG. 1 embodiment, a fixed rather than an adaptive threshold is used to determine when impulse noise is present.

One exemplary way of determining the fixed or preselected impulse noise threshold value B is as follows. First estimate the typical mean-squared (MS) noise energy value in the receiver being implemented. Then multiply this value by, e.g., a factor of 16, so that gaussian noise having an amplitude less than about three or four times sigma, i.e., the root-mean-square (RMS) gaussian noise, will not be falsely interpreted as a noise impulse. In such an embodiment, if the threshold B for declaring an impulse is four times sigma in error amplitude, e.g., squared, it will be 16 times sigma squared or 16 times the typical MS noise. The value B used as a threshold may be selected as a function of the particular receiver circuit being implemented and how many false impulse detections can be tolerated. Thus, depending on the particular embodiment, it is possible to select a threshold B to suit a particular receiver circuit as a function of where on the expected gaussian noise probability function it is desirable to operate the particular receiver circuit.

Referring once again to FIG. 1, it can be seen that the output of the comparator 26, the signal SEL, is asserted when the sliced error energy value A exceeds the impulse threshold B indicating the detection of impulse noise. The signal SEL is supplied to a control input of the MUX 16. A first input of the MUX 16 is supplied with the value zero while a second input is supplied with the phase error signal generated by the phase detector circuit 18. The MUX 16 is responsive to the SEL signal to output the zero value supplied to the MUXes first input when the SEL signal is asserted and to output the phase error signal supplied to the second input when the SEL signal is deasserted. Accordingly, the MUX 16 will output a signal having a value of zero when impulse noise is detected and a value corresponding to the calculated phase error at other times. The output of the MUX 16 is supplied to the input of the PEC circuit 14 which is used to generate the phase error correction signal supplied to the derotator 12 to thereby control the adjustment of the derotator 12 in an attempt to eliminate or reduce the amount of phase error.

By having the MUX 16 output a phase error value of zero when impulse noise is detected the carrier recovery circuit is disabled in the sense that the current phase error is declared to be zero. Although this phase error value will usually be incorrect, it is generally more benign than calculating a possibly large and erroneous phase error based upon a symbol that has been contaminated as the result of the presence of impulse noise.

When an impulse is declared by, e.g., the assertion of the SEL signal, the operation of selected circuits such as the MUX 16 may be modified for a period of multiple symbols, rather than just one symbol, e.g., the symbol which resulted in the SEL signal being asserted. In this way, if impulse noise remains on the signal being demodulated but subsequent impulses do not exceed the impulse threshold, e.g., the preselected value B, the circuit 10 will still operate in the impulse state, i.e., as if impulse noise was still being detected.

In addition to disabling carrier recovery operation when an impulse is detected, in some cases, it will be beneficial to also disable other circuits which use received symbol values, for example: decision directed automatic gain control (AGC) circuits and adaptive filter, e.g., equalizer, tap coefficient update circuits. In order to control such circuits in response to the detection of impulse noise, the SEL signal may be supplied thereto as illustrated in FIG. 1 by the SEL signal line extending to other circuits.

Figure 2:
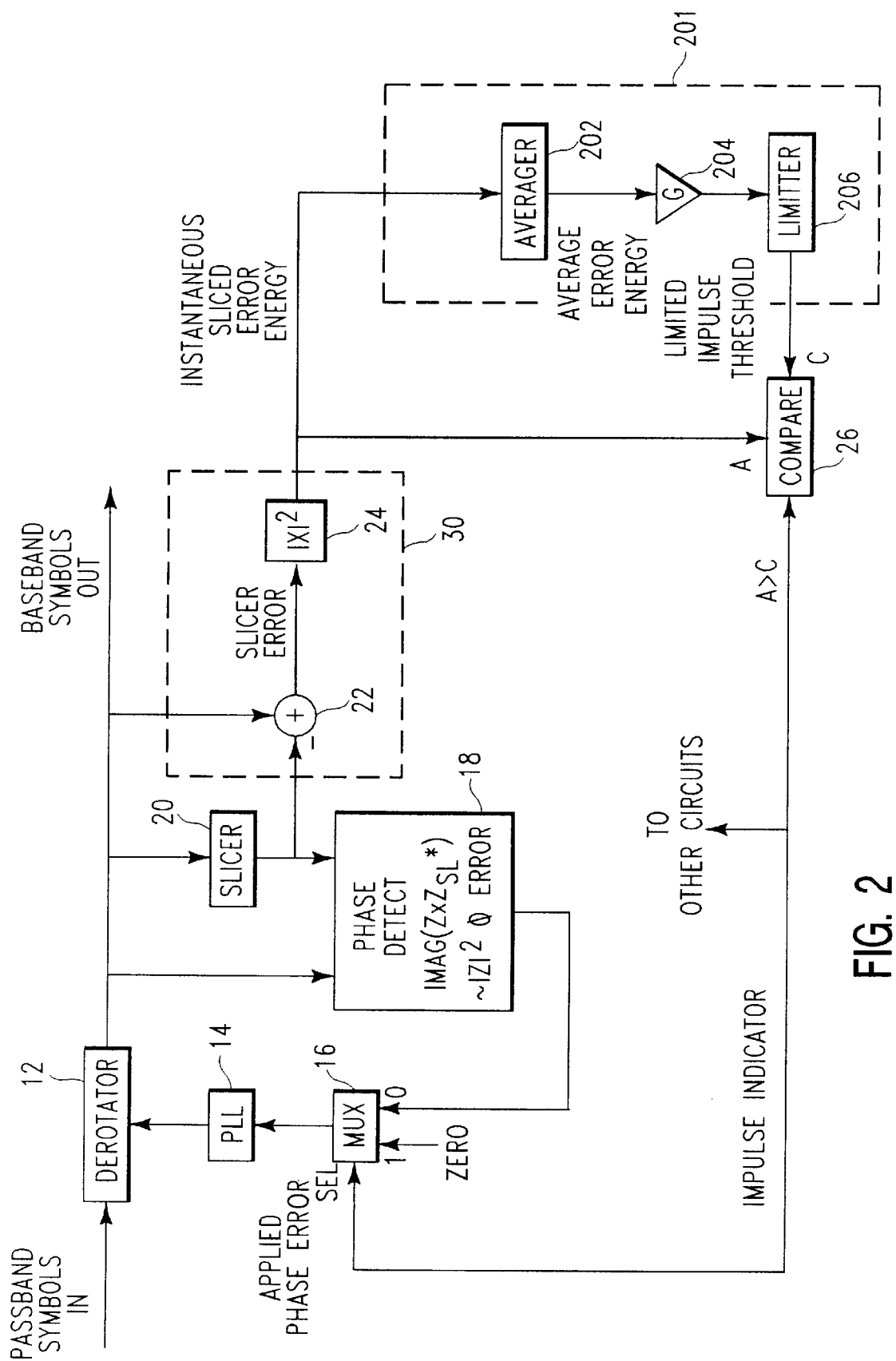
FIG. 2 is a schematic block diagram of an impulse noise detection circuit implemented in accordance with a second embodiment of the present invention.

While the embodiment illustrated in FIG. 1 relies on the use of a fixed or preselected threshold for determining the presence of impulse noise, in the embodiment of FIG. 2, the impulse noise threshold is determined on an adaptive basis.

Referring now to FIG. 2, it can be seen that the FIG. 2 embodiment is similar to FIG. 1 but includes additional circuitry, e.g., an impulse noise threshold determination circuit 201 for the adaptive generation of an impulse threshold as a function of the instantaneous estimated sliced error energy values output by the squarer 24. For the purpose of brevity, circuitry in FIG. 2 that is the same as, or similar to, the previously described circuitry, as indicated by the use of the same reference numerals used in FIG. 1, will not be described again in detail.

As illustrated in FIG. 2, the impulse noise threshold determination circuit 201 comprises an averager 202 which has its output coupled to the input of a gain element 204. The output of the gain element 206 is, in turn, coupled to the input of a threshold limiter circuit 206. The threshold limiter circuit 206 generates and outputs a limited impulse threshold value which serves as the impulse noise threshold value C supplied to the comparitor circuit 26.

In the FIG. 2 embodiment, the instantaneous sliced error energy signal output by the squarer 24 is supplied to the input of the averager 202 which averages the error energy over, e.g., a period of 1000 symbols, to generate an average sliced error energy value. In this manner, an average sliced error energy is calculated by integrating up the instantaneous sliced error energy over a large number of symbols.

The average sliced error energy value is supplied to the input of the gain circuit 204 which multiplies the average sliced error energy value by a preselected value represented by the letter G to produce an impulse noise threshold value. In one particular embodiment the preselected value G is greater than one.

The demodulator circuit of FIG. 2 may be so noisy that a fixed multiplication of the average sliced error will result in an unrealistically high impulse threshold. To avoid this possible problem, in the embodiment of FIG. 2, the limiter circuit 206 is used to impose a preselected maximum permitted threshold value on all impulse noise thresholds that meet or exceed the maximum permitted impulse threshold value. The maximum permitted impulse threshold value may be selected to correspond to, e.g., one or two decision levels. In such a case, when the sliced error energy value exceeds the maximum permitted impulse threshold value, the presence of impulse noise can be declared with a high degree of confidence.

The limited impulse noise threshold that is output by the limiter circuit 206 is supplied to comparator 26. The sliced error energy value output by the squarer 24 is compared to the limited impulse noise threshold value C and if the value C is exceed for any symbol, impulse noise is declared for that symbol by the assertion of the signal SEL.

Accordingly, as in the embodiment of FIG. 1, when a symbol including impulse noise arrives the signal SEL will be asserted and the carrier recover circuit will be disabled, i.e., the current phase error will be declared to be zero at the output of the MUX 16.

Figure 3:
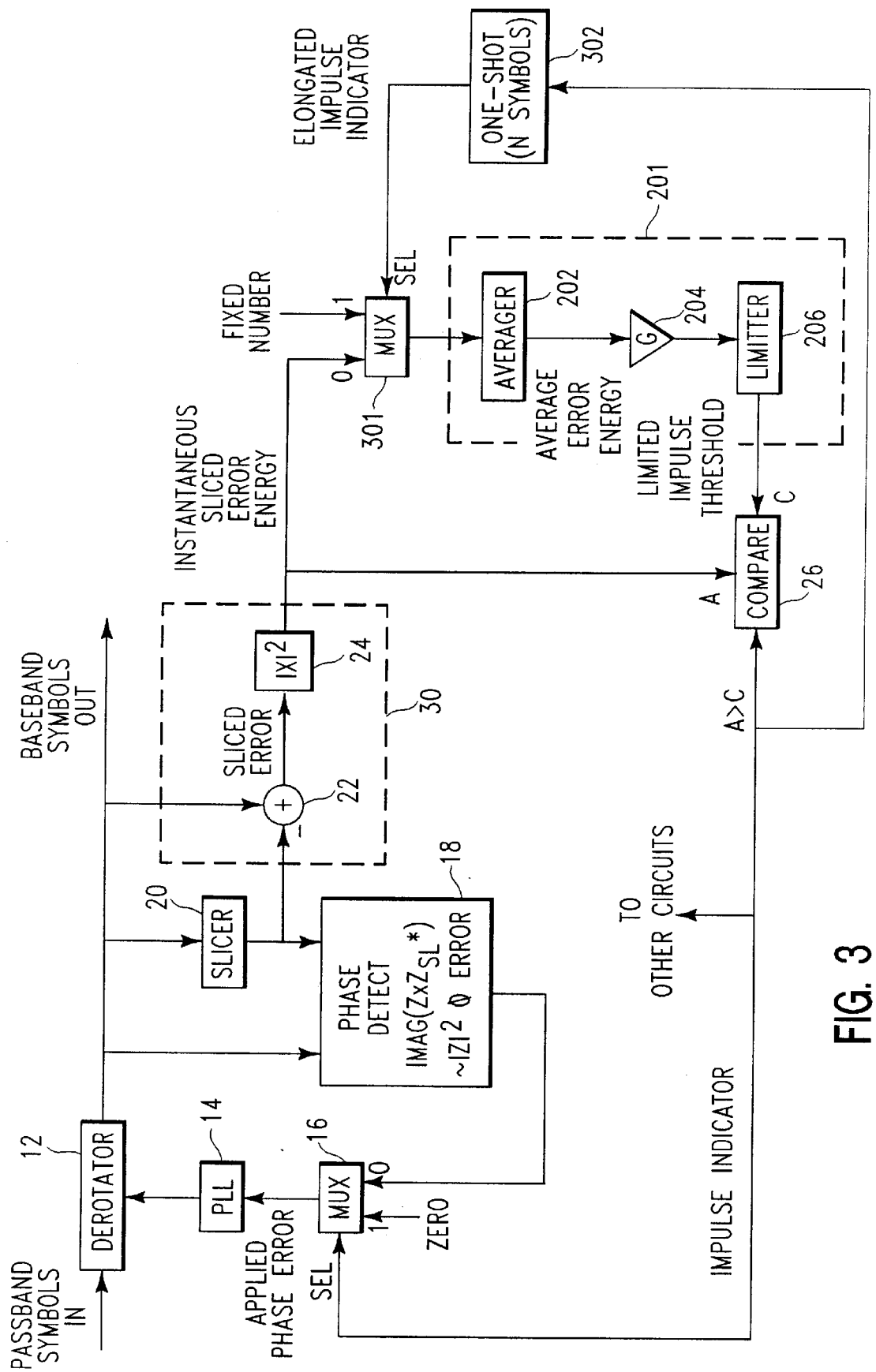
FIG. 3 is a schematic block diagram of an impulse noise detection circuit implemented in accordance with a third embodiment of the present invention.

Referring now to FIG. 3, it can be seen that FIG. 3 illustrates yet another embodiment which shares some similarities with the FIG. 1 and FIG. 2 embodiments but which also includes some additional circuitry, i.e., a MUX 301 and a one-shot circuit 302. For the purpose of brevity, circuitry in FIG. 3 that is the same as or similar to the previously described circuitry, as indicated by the use of the same reference numerals used in FIGS. 1 and 2, will not be described again in detail.

The noise impulse detection circuitry of the embodiment of FIG. 3, as will be discussed in greater detail below, is particularly well suited for use in QAM carrier recovery circuits such as the one described in U.S. Pat. No. 5,471,508, which is hereby expressly incorporated by reference.

In the QAM carrier recovery circuit illustrated in the '742 application, and FIG. 10 of that application, in particular, the average sliced error calculation is already performed by an average error energy determining circuit (see element 700 of FIG. 10) as part of determining whether the carrier recovery circuit is in a locked state or not. Also in that implementation of carrier recovery, it makes sense to blank the phase error during impulses only when the carrier recovery circuit is in the locked mode. It is in the locked mode when it has been determined that symbols are largely falling within their respective correct decision regions so that decision directed carrier recover and equalizer coefficient updates are effective.

The carrier recovery circuit described in the U.S. Pat. No. 5,471,508 operates in two modes, i.e., acquisition and lock, with the mode being determined as a function of the measured average sliced error energy. If the average sliced error energy falls above a threshold the system will be declared in acquisition. If the average sliced error energy falls below a threshold, the system will be declared in lock.

When the input signal has impulse noise, an impulse may create an extremely large error energy on the symbol(s) that are present. This error energy, when averaged, may cause the average sliced error energy to exceed the acquisition threshold for carrier recovery and therefore acquisition will be declared. This is so, even though the carrier may still be well locked.

In order to avoid false switching from lock to acquisition, in carrier recover circuits such as that disclosed in the U.S. Pat. No. 5,471,508 when noise impulses are detected, a fixed number, rather than the actual sliced error energy for the symbol or symbols associated with the impulse noise can be fed into the energy averager. In the embodiment illustrated in FIG. 3, the MUX 301, is used for supplying the fixed number to the averager 202 when impulse noise is detected, as opposed to the actual sliced error energy.

The fixed number supplied to the second input of the MUX 301 is selected in one embodiment to be large enough so that it exceeds the threshold for switching the carrier recovery circuit into which it is incorporated into acquisition mode. That is, if the carrier actually is not locked, the impulse detector may think that the rotating constellation is full of impulses, and continually pass this fixed number to the averager 202. In such a case, the output of the averager should exceed the threshold for switching into acquisition mode. The fixed number supplied to the second input of the MUX 301 should, at the same time, be small enough so that, if the expected duration of impulses is N symbols, the fixed number put into the error energy averager N times will not cause the average error energy to exceed the threshold for switching the carrier recovery circuit into acquisition mode. This depends on both the expected impulse duration represented in terms of N symbols and the averaging duration in symbols represented by M, where M and N are integers. The averager 202 may be a block oriented averager which is periodically reset or it may be a continuous low-pass filter which is periodically examined for its output value.

The circuit illustrated in FIG. 3, includes a one-shot used to elongate the period the control signal supplied to the MUX 301 will be asserted when impulse noise is detected. The one-shot 302 is thus used to ensure that large sliced error energy caused by impulse noise will not falsely throw a carrier-recovery system into acquisition mode when impulses are detected. In such an embodiment, it is assumed that the impulsive state may actually extend for multiple symbols, but that not all of these actual impulses will be detected. Therefore, an extender, e.g., the one-shot 302, is used to extend the period during which the fixed number is supplied to the averager 202. A small number around ten pulses has been experimentally found to be a good value to use as the number N of symbols for which the fixed number should be supplied to the averager 202 upon detection of an impulse when demodulating QAM signals.

While the impulse noise error detection circuit of the present invention has been described in the embodiments of FIGS. 1–3 as part of a QAM carrier recovery circuit, the impulse detection methods and circuits of the present invention can also be used for vestigial sideband (VSB) applications. In the VSB case however, the sliced error is based on a one-dimensional rather than two-dimensional error relative to the target levels. In the VSB case, the impulse noise detection circuit of the present invention can be used to disable, e.g., equalizer coefficient updates, carrier recovery circuitry, or decision dependent update circuits.

Figure 4:
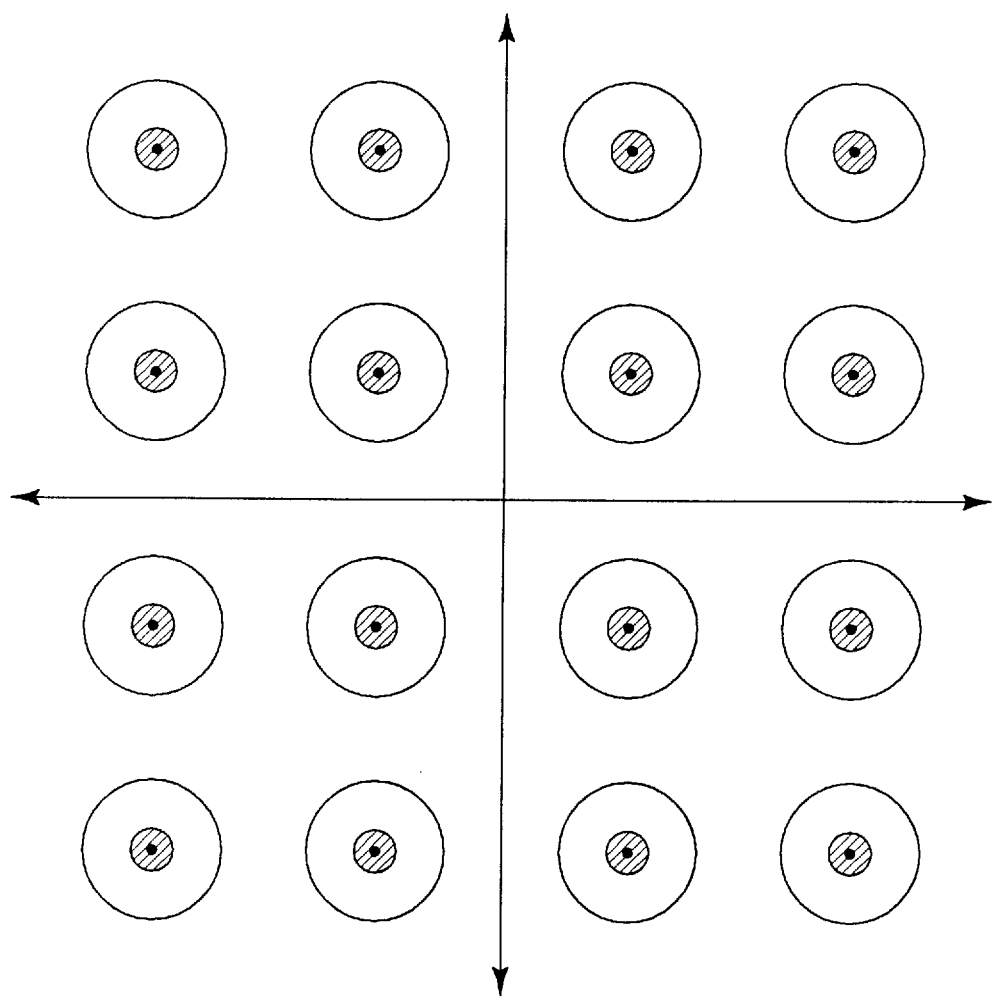
FIG. 4 illustrates an exemplary QAM constellation.

Referring now briefly to FIG. 4, there is illustrated, for exemplary purposes, a 16-QAM constellation. The dot in the center of each set of circles represents a target symbol. The shaded areas surrounding each target symbol represent the areas within which the sliced error energy is below the means-squared value. The unshaded areas within each set of circles represents the regions outside of which an impulse is declared in accordance with the present invention. Note that if gaussian noise decreases, the size of the unshaded areas within each set of circles will be decreased in the cases where an adaptive impulse threshold is used as opposed to a fixed threshold. In such embodiments, e.g., the embodiments of FIGS. 2 and 3, the "impulse" region of the constellation illustrated in FIG. 4 will increase as gaussian noise decreases so that impulses can be more reliably detected.

The methods and apparatus of the present invention can be used in demodulators for QAM, VSB or other digital modulation schemes wherein predetermined target levels or symbols are employed and impulsive noise is possible. Examples of possible applications include advanced television (ATV) transmission via QAM over cable and via VSB over terrestrial broadcast.

What is claimed is:

1. A method of detecting impulse noise in a signal including a plurality of symbols, the method comprising the steps of:
    generating an error estimate by comparing a symbol in the signal to a target value;
    comparing the error estimate to an impulse noise threshold; and
    generating an impulse noise signal when the error estimate exceeds the impulse noise threshold.

2. The method of claim 1,
    wherein the signal is an amplitude modulated signal; and
    wherein the target value is generated by performing a slicing operation on the symbol.

3. The method of claim 2, wherein the step of generating the error estimate includes the step of measuring sliced error energy.

4. The method of claim 1, further comprising the step of:
    adaptively determining the impulse noise threshold as a function of the signal.

5. The method of claim 4,
    wherein the signal is an amplitude modulated signal;
    wherein the step of generating an error estimate is performed for each symbol included in the amplitude modulated signal; and
    wherein the step of adaptively determining the impulse noise threshold includes the step of:
        averaging the error estimate for a number of symbols to generate an average error estimate.

6. The method of claim 5, wherein the step of adaptively determining the impulse noise threshold further includes the step of:
    multiplying the average error estimate by a preselected number greater than one to generate the impulse noise threshold.

7. The method of claim 6, wherein the step of adaptively determining the impulse noise threshold further includes the step of:
    limiting the impulse noise threshold to a preselected maximum value when the generated impulse noise threshold exceeds the preselected maximum value.

8. The method of claim 7, wherein the step of adaptively determining the impulse noise threshold further includes the step of:
    using a fixed value, as opposed to the error estimate, in the averaging step when impulse noise is detected.

9. An impulse noise detection circuit, comprising:
    a slicer for receiving an amplitude modulated signal including baseband symbols and for generating target symbols;
    a sliced error estimation circuit coupled to the slicer for generating an instantaneous error energy signal as a function of the baseband and target symbols;
    a comparator coupled to the sliced error estimation circuit for comparing the instantaneous error energy signal to an impulse noise threshold, the comparator generating an impulse indicator signal indicative of the presence of impulse noise when the instantaneous error energy signal assumes a value that exceeds the impulse noise threshold.

10. The impulse noise detection circuit of claim 9, further comprising:
    adaptive impulse threshold generation means for generating the impulse noise threshold as a function of the instantaneous error energy signal.

11. The impulse noise detection circuit of claim 9, further comprising:
    a phase error correction circuit coupled to the comparator; and
    means for disabling the phase error correction circuit in response to the assertion of the impulse noise indicator signal.

12. The impulse noise detection circuit of claim 9, further comprising:
    an averager coupled to the sliced error estimation circuit for generating an average error energy signal from the instantaneous error energy signal; and
    a multiplier coupled to the averager and the comparator for applying a gain greater than one to the average error energy signal to generate the impulse noise threshold.

13. The impulse noise detection circuit of claim 12, further comprising:

a limiter circuit coupled to the multiplier and the comparator, the limiter circuit limiting the maximum value of the impulse threshold.

14. An impulse noise detection circuit, comprising:

a slicer for receiving baseband symbols and for generating target symbols;

a sliced error estimation circuit coupled to the slicer for generating an instantaneous error energy signal as a function of the baseband and target symbols;

a comparator coupled to the sliced error estimation circuit for comparing the instantaneous error energy signal to an impulse noise threshold, the comparator generating an impulse noise indicator signal indicative of the presence of impulse noise when the instantaneous error energy signal assumes a value that exceeds the impulse noise threshold;

an averager coupled to the sliced error estimation circuit for generating an average error energy signal;

means responsive to the impulse noise indicator signal for inputting either the instantaneous error energy signal or a signal representing a fixed number into the averager; and a multiplier coupled to the averager and the comparator for applying a gain greater than one to the average error energy signal to generate the impulse threshold.

15. The impulse noise detection circuit of claim 14, wherein the means responsive to the impulse noise indicator signal is a multiplexer which includes a control input;

the impulse noise detection circuit further comprising a one-shot circuit coupled to the comparator and the control input of the multiplexer.

16. An apparatus for detecting impulse noise in a signal including a symbol, the apparatus comprising:

error estimation means for generating an estimate of the error between a measured symbol value and a target symbol value; and comparison means for comparing the estimated error to an impulse noise threshold and for generating a signal indicative of the presence of impulse noise when the estimated error exceeds the impulse noise threshold.

17. The apparatus of claim 16, further comprising:

means for performing a slicing operation on the symbol to generate the target symbol value.

18. The apparatus of claim 17, further comprising:

means for adaptively generating the impulse noise threshold.

19. The apparatus of claim 18, further comprising:

means for disabling a carrier recovery operation in response to an indication of the presence of impulse noise from the comparison means.

20. A method of detecting impulse noise in a signal which represents digital data, the method comprising the steps of:

generating an estimate of an error between a measured signal value and one of a plurality of discrete signal target values; and comparing the estimated error to an impulse noise threshold to determine if the impulse noise threshold has been exceeded.

21. The method of claim 20, further comprising the step of:

adaptively generating the impulse noise threshold.

22. The method of claim 21, wherein the signal is a quadrature amplitude modulated signal.

23. The method of claim 21, wherein the signal is a vestigial sideband signal.

24. The method of claim 1, wherein the signal is a quadrature amplitude modulated signal.

25. The method of claim 1, wherein the signal is a vestigial sideband signal.

* * * * *